METHOD FOR ISOLATING INDIVIDUAL DEVICES IN AN INTEGRATED CIRCUIT MONOLITHIC BAR

Filed June 30, 1965

INVENTOR
Frederick J. Strieter
BY John G. Graham
ATTORNEY

INVENTOR
Frederick J. Strieter
BY John D. Graham
ATTORNEY

INVENTOR
Frederick J. Streiter
BY John G. Graham
ATTORNEY

INVENTOR
Frederick J. Strieter

BY John D. Graham
ATTORNEY

United States Patent Office 3,442,011
Patented May 6, 1969

3,442,011

METHOD FOR ISOLATING INDIVIDUAL DEVICES IN AN INTEGRATED CIRCUIT MONOLITHIC BAR

Frederick J. Strieter, Richardson, Tex., assignor to Texas Instruments Incorporated, Dallas, Tex., a corporation of Delaware Filed June 30, 1965, Ser. No. 468,209
Int. Cl. H01l 7/00
U.S. Cl. 29—578 9 Claims

ABSTRACT OF THE DISCLOSURE

Disclosed is a method for fabricating individual components within a semiconductor body by converting a portion of the semiconductor body to an insulating material to thereby electrically isolate unconverted portions of the semiconductor body.

This invention relates to integrated circuits, and more particularly to miniature electronic circuits of the type having all of the necessary circuit components joined together by a common substrate but yet electrically isolated from one another through the substrate.

The increased growth of interest in microminiaturization has been reflected in the semiconductor field by the rapid development of integrated circuitry whereby all of the individual active and/or passive components are formed within a single wafer of semiconductor material, the components being interconnected to perform the desired circuit function. An embodiment of such an arrangement was first disclosed by Jack S. Kilby in Patent No. 3,138,743, issued June 23, 1964, and represented a considerable advance over what was then known, offering greater reliability in performance and substantial savings in cost and space.

The formation of all components in a single semiconductor wafer, however, presents the problem of electrically isolating the circuit components from one another. In particular, when a number of transistors are formed within one portion of the wafer substrate, with the substrate forming the collector regions of the transistors, it is necessary for many circuit applications to avoid having the collectors in common. Various isolation techniques have been developed to solve this problem, many of them possessing certain disadvantages.

It is therefore a principal object of this invention to provide an improved method of isolation whereby all of the necessary circuit components of an integrated circuit are joined by a common substrate and yet are electrically isolated through the substrate.

In accordance with this object, the invention involves the selective conversion of portions of a semiconductor wafer from semiconducting to insulating, leaving unconverted "pockets" of single-crystal semiconducting material isolated from each other by the insulating portions.

This conversion is achieved by masking the portions of the semiconductor wafer which are to remain semiconducting, and thereafter chemically reacting the unmasked portions with oxygen, as one example, to form a new species of material (in the case of oxygen the new species would be silicon oxide) which is insulating. The "pockets" of unconverted semiconductor material serve as regions into which subsequent diffusions may be made or epitaxial depositions carried out in order to form diode or transistor structures, for example, of an integrated circuit, which are joined by a common substrate and yet are electrically isolated through the substrate by the insulating portions.

The novel features believed to be characteristic of this invention are set forth with particularity in the appended claims. The invention itself, however, as well as further objects and advantages thereof, may best be understood by reference to the following detailed description of illustrative embodiments, when read in conjunction with the appended claims and the accompanying drawings, wherein:

Figure 1:
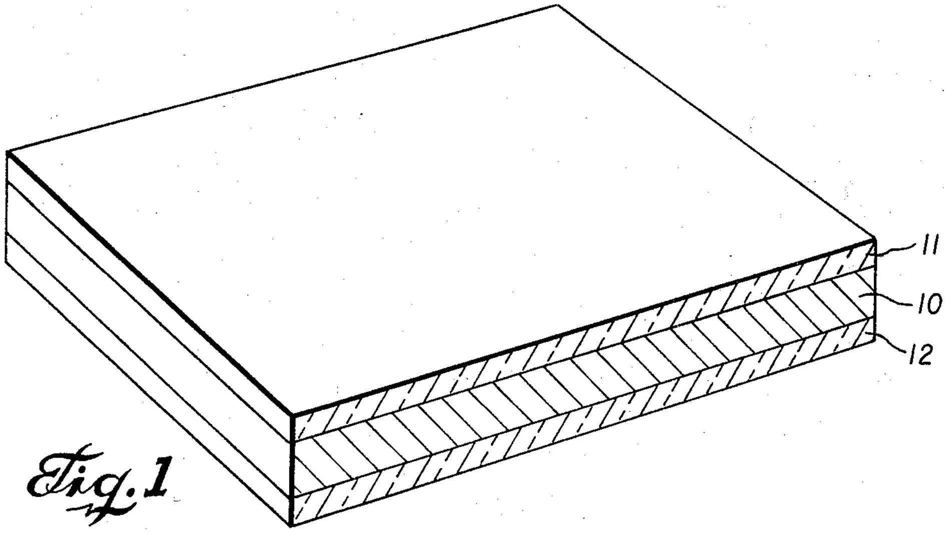
FIGURE 1 is a pictorial view in section of a semiconductor wafer in an early stage of the production of an integrated circuit in accordance with the process of this invention.

Referring to FIGURE 1, there is now described the first step in the method of this invention. A slice of single crystal semiconductor material, such as silicon, is used as the starting material. The conductivity may be either N-type or P-type, and may be of any desirable resistivity. As a preferred embodiment, however, a slice of single-crystal low resistivity N+ silicon semiconductor material having a resistivity of perhaps 0.010 to 0.025 Ω/cm. is used as the starting material. This slice may be about one inch in diameter and approximately one mil thick. A small segment of the slice may ge represented as a chip or wafer 10, which represents the segment occupied by one integrated circuit. Actually, the slice would contain dozens or even hundreds of the segments such as the wafer 10.

Oxide layers 11 and 12 are then formed upon the upper and lower surfaces or faces of the wafer 10, as depicted in FIGURE 1. The oxide layers, which might be of silicon oxide for example, should preferably be of a thickness in excess of 50,000 A., and may be formed by any conventional technique. For example, they may be thermally grown by heating the entire wafer to a temperature of approximately 1200° C. in the presence of oxygen for a length of time sufficient to achieve the desired thickness of the layers. An alternative method of forming the oxide layers 11 and 12, however, would be the "oxidative" technique, by which oxygen and tetraethoxysilane are reacted in vapor form at 250–50° C. in a chamber containing the wafer 10. The reaction mixture is obtained by bubbling oxygen through liquid tetraethoxysilane at room temperature, then combining the gaseous mixture with excess oxygen and passing it into a furnace tube containing the wafer 10 where the oxidation takes place within the temperature range above given. The silicon oxide thereby produced is deposited upon the upper and lower surfaces of the wafer 10 at a rate from 1300°–1400° A. per minute to produce the layers 11 and 12.

Figure 2:
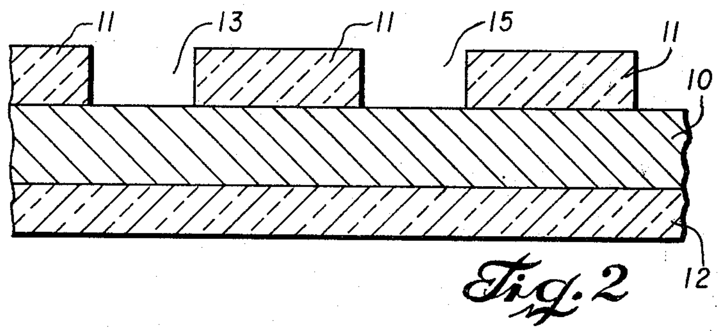
FIGURES 2–4 are elevational views in section of the semiconductor body of FIGURE 1 in successive stages of production.

Through the use of photographic masking and etching techniques, for example, select portions of the oxide layer 11 are removed, as shown in FIGURE 2, as to expose corresponding portions of the low resistivity wafer 10 within the windows 13 and 15, for example. This removal may be accomplished by covering the oxide layer 11 with photoresist, masking select portions of the photoresist, exposing and developing the photoresist, and etching away the unmasked areas of the oxide.

Figure 3:
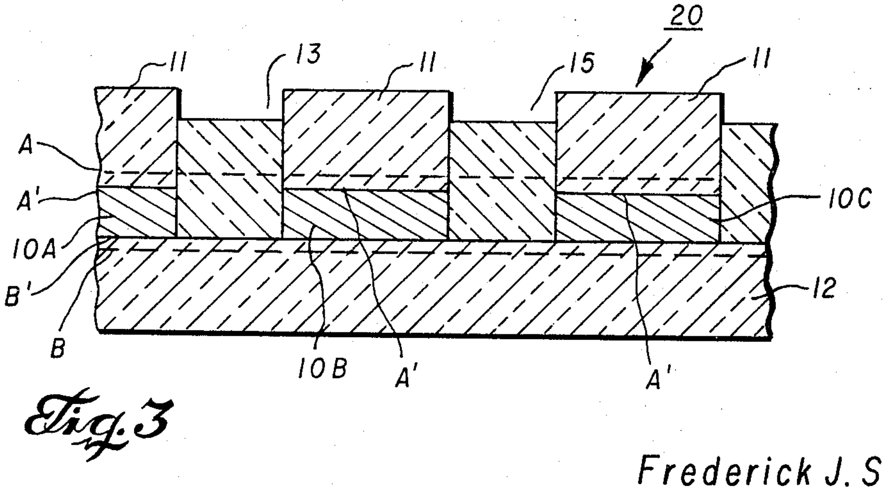

As the next step in the invention, the selectively masked slice 10 is exposed to steam at approximately 1200° C. As a consequence, the exposed portions of the upper surface of the silicon wafer 10 within the windows 13 and 15 react with the steam and are thermally oxidized at a rate given approximately by the equation $X^2=.8t$ where X is in microns and $t$ is in hours. At the same time, the silicon material at the lower surface of the slice 10 adjacent the oxide layer 12 is also thermally oxidized (although at a much slower rate since it is not exposed) resulting in an increase in the width of the oxide layer 12 as depicted in FIGURE 3. These simultaneous oxidations continue until they intersect at the location represented by line B′, thereby to completely oxidize the portions of the wafer 10 below the windows 13 and 15. The dashed line B represents the original interface between the oxide layer 12 and the lower surface of the wafer prior to the thermal oxidation operation.

The segments of the wafer 10 intermediate the unremoved portions of the oxide mask 11 and the oxide layer 12 are also thermally oxidized (as denoted in FIGURE 3 by the advance of the oxide-semiconductor interface from the pre-thermal oxidation position represented by dashed lines A and B to the post-thermal oxidation position represented by lines A′ and B′, respectively). However, due to the fact that these wafer segments are masked by the oxide layers 11 and 12, the oxidation proceeds at a much slower rate than the oxidation of the wafer segments which are exposed beneath the windows 13 and 15. Consequently, when these latter segments have been completely oxidized, individual pockets of unoxidized low resistivity N+ single crystal semiconductor material depicted in FIGURE 3 as 10A, 10B, and 10C remain completely isolated from each other by the silicon oxide material which surrounds each of them.

Since the isolation of the monocrystalline portions 10A, 10B, and 10C depends upon the exposed portions of the silicon wafer beneath the apertures 13 and 15 oxidizing at a greater rate than the masked portions of the wafer, and since the oxidation rate of the silicon material is related inversely to the amount of oxide masking, it is desirable to initially form the masking layers to a substantial thickness, preferably in excess of 50,000 A. This is particularly true since, as the unmasked portions of the silicon wafer are oxidized, they will form their own mask, thereby slowing down their oxidation rate. Consequently, the thicker the slice of silicon material used as the starting material, the thicker need be the original oxide masking. As an example, it was observed that for a silicon wafer or slice 10 of an initial thickness of 1 mil, it was desirable to initially form the silicon oxide layers 11 and 12 shown in FIGURE 1 a thickness of approximately 150,000 A.

Figures 4, 5, 6:
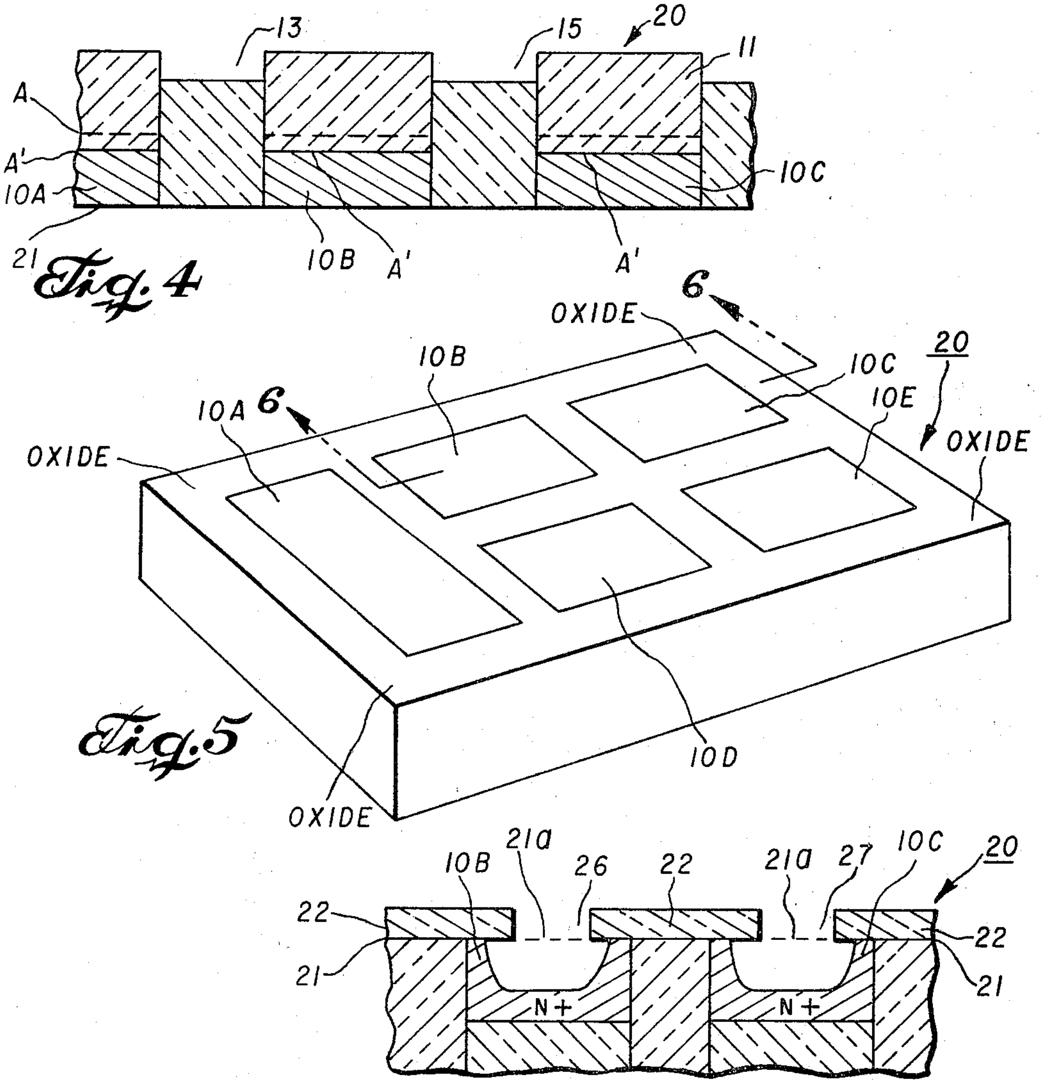
FIGURE 5 is a pictorial view of the lower side of the semiconductor body of FIGURE 4.
FIGURES 6–8 are sectional views of a portion of the wafer of FIGURE 5 taken along the line 6—6, showing subsequent steps of the process of this invention.

As the next step in the process of this invention the oxidized wafer structure 20 of FIGURE 3 is subjected to a lapping and polishing treatment on its lower face to remove just the oxide layer 12. This removal may also be accomplished by a carefully controlled etching process which does not also remove the oxide insulation between the single-crystal pockets. The resulting structure 20 appears as shown in FIGURE 4. Inverting the device and looking at what was the bottom surface or face 21 of FIGURE 4, but will now be considered the top face of the unit, the structure 20 appears as in FIGURE 5. Each of the low resistivity N+ monocrystalline portions 10A–10D is insulated from the others by the surrounding silicon oxide. (As an alternative to removing the oxide layer 12, the structure 20 may be lapped from its upper face to remove the excess oxide, thereby exposing the isolated pockets 10A, 10B and 10C at their upper surfaces.)

An oxide layer 22 is then formed upon the upper surface or 21 of the wafer structure 20, as depicted in FIGURE 6. The oxide layer, which might be silicon oxide for example, should preferably be of a thickness in excess of 10,000 A., and may be formed by conventional techniques. Through the use of photographic masking and etching techniques, for example, select portions of the oxide layer 22 are removed so as to expose corresponding portions of the low resistivity semiconductor substrates

10B and 10C within the apertures or windows 26 and 27, respectively. The removal may be accomplished by covering the oxide layer 22 with photoresist, exposing and developing the photoresist, and etching away the unmasked areas of the oxide. By this method, the oxide mask shown in section in FIGURE 6 is produced directly on the substrate surface 21. The mask thus produced limits the area of the substrate to be affected by the subsequent vapor etch and epitaxial redeposition steps.

Figure 7:
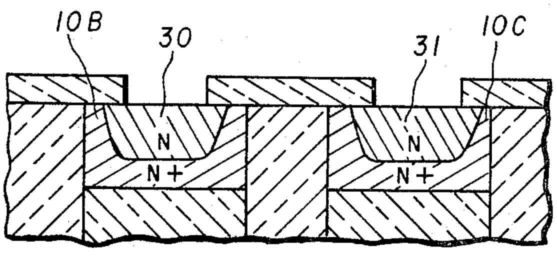

As the next step in the process of the present invention the wafer structure 20 is subjected to a selective vapor etch which removes select portions of the low resistivity substrates 10B and 10C below the dotted line 21*a*, as observed in FIGURE 6. The wafer structure 20 is thereafter subjected to an epitaxial deposition step whereby, as shown in FIGURE 7, regions 30 and 31 of high resistivity N-type semiconducting material are redeposited within the vacant spaces produced by the vapor etch step previously described. The N-type regions 30 and 31 are formed adjacent the low resistivity N+ regions 10B and 10C, also depicted in FIGURE 7.

Various desired arrangements may be utilized as well as various techniques may be applied in order to accomplish the steps of vapor etching and epitaxially redepositing within the unmasked regions. One desirable process is described in copending application of Alexander et al., Ser. No. 435,633, filed Feb. 26, 1965, and assigned to the assignee of the present invention.

Figure 8:
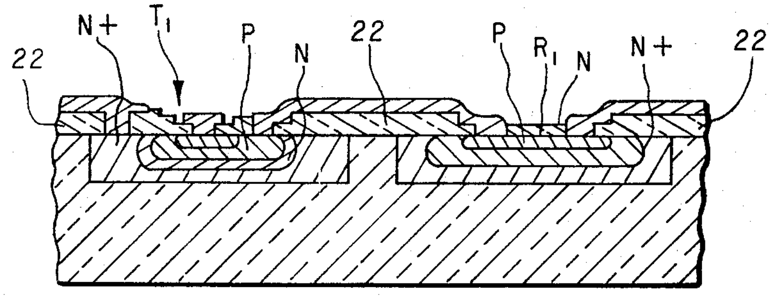
Figure 9:
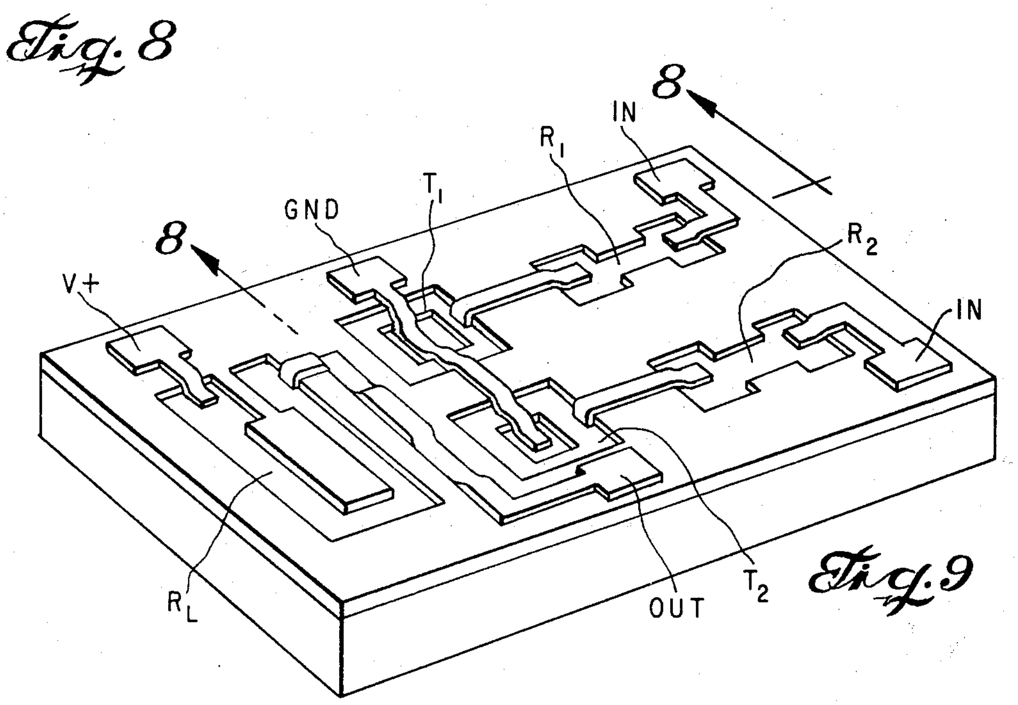
FIGURE 9 is a pictorial view of the completed device described with reference to FIGURES 1–8.
Figure 10:
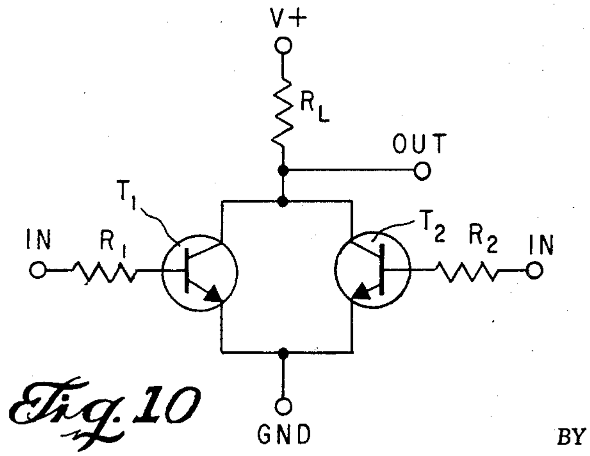
FIGURE 10 is a schematic diagram of the device shown in FIGURE 9.

Referring again to FIGURE 7, it will be observed that the layers 30 and 31 may now serve as regions into which subsequent diffusions, or upon which epitaxial depositions, may be made in order to fabricate various active and passive components of an integrated circuit. Referring now to FIGURE 8, a sectional view of a completed integrated circuit is seen, with an NPN transistor $T_1$ and a resistor $R_1$ having been formed by diffusion in the N-type deposited regions 30 and 31. A P-type diffused region provides the base of the transistor, while an elongated P-type region formed simultaneously with the base provides the resistor $R_1$. N-type diffused regions provide the transistor emitters. The diffusion operations utilize silicon oxide masking so that the oxide layer 22 acquires a stepped configuration in the final device. Openings are made in the oxide where contact is necessary, then metal film is deposited over the oxide and selectively removed to provide the desired contacts and interconnections. The completed unit is seen in FIGURE 9, with the transistors $T_1$ and $T_2$ and the resistors $R_1$, $R_2$ and $R_L$ along with the metal interconnecting providing a logic circuit as seen in schematic form in FIGURE 10.

This invention therefore allows the fabrication of these discrete circuit components within a single wafer and yet electrically isolated from each other. Although the previously described method of isolating the components involves simultaneously oxidizing portions of the semiconductor wafer from both surfaces until the oxidation fronts meet, this invention also contemplates oxidizing completely through the portions of a wafer from only one surface. An example of this technique is described with reference to the following illustrative embodiment.

Figure 11:
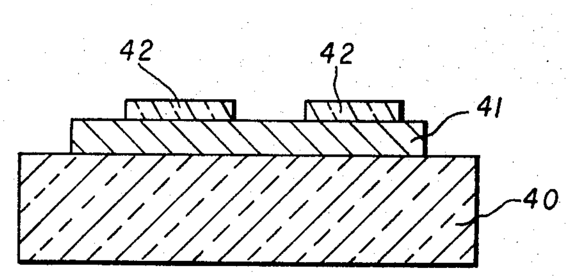
FIGURES 11–13 depict an additional embodiment utilizing the concept of this invention.
Figure 12:
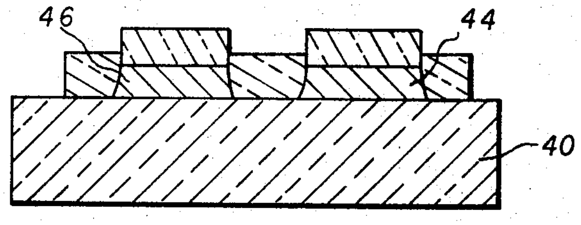
Figure 13:
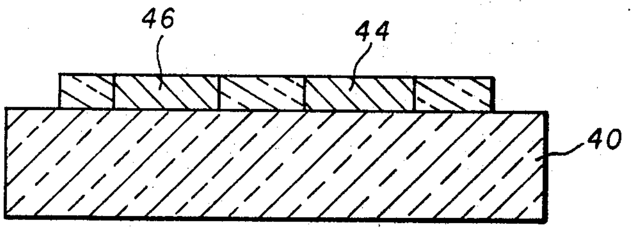

Referring to FIGURE 11, a single crystal semiconductor chip or water 41 is mounted upon an insulating or semi-insulating body 40 by a suitable cement. As an alternative to physically cementing the wafer 41 to the body 40, the wafer 40 may be epitaxially deposited upon a semi-insulating body 40. For example, germanium semiconducting material may be epitaxially deposited upon chromium-doped or iron-doped gallium arsenide material, the latter serving as the semi-insulating body 40. By semi-insulating is meant a material havnig a resistivity greater than $10^3$ ohm-cm. A thick oxide layer 42 is then formed as before upon the wafer 41 and selectively removed so as to expose select portions of the upper surface of the wafer 41. The exposed portions of the upper surface are subsequently thermally oxidized so that the oxidation front proceeds from the top surface of the wafer to the insulating substrate 40, thereby to leave pockets of single crystal material 44 and 46 completely surrounded and isolated by the oxide and the substrate 40, as depicted in FIGURE 12. The top surface of the structure is then lapped or chemically etched so as to remove the oxide above the pockets 44 and 46 and provide a planar surface for subsequent device fabrication. The resulting structure is shown in FIGURE 13, the pockets 44 and 46 serving as regions into which subsequent diffusions, or upon which epitaxial depositions may be made in order to fabricate various components of an integrated circuit in the same manner as set forth above with reference to FIGURES 5–10.

Although the previously described embodiments have utilized a thermal oxidation step in order to selectively convert the unmasked portions of the semiconductor wafer to insulating material, thereby isolating the remaining portions, this step is not to be construed in a restrictive manner since any method which achieves this conversion is encompassed by this invention irrespective of the particular process or the particular insulating material which results. For example, it may be desirable to use a low temperature process, such as the one described by Joseph R. Ligenza in Abstract No. 73, "Extended Abstracts"—Electronic Division, the Electronochemical Soc., Spring Meeting—Toronto, May 3–7, 1964, for selectively oxidizing the semiconductor material in order to achieve the desired isolation. Using this technique it will be possible to form the circuit components in the semiconductor wafer before the isolation step. Similarly, instead of reacting the unmasked portions of the semiconductor wafer with oxygen, thereby forming an oxide as the insulating material, it is also possible to react these portions with nitrogen or carbon, for example. In addition, although the material of the semiconductor wafer has been oftentimes mentioned as silicon semiconductor material, any type of semiconductor material may be used, such as germanium or gallium arsenide.

The particular devices formed in the isolated islands or pockets may be transistors, diodes, resistors, and like devices formed by impurity diffusion or epitaxial deposition, as well as metal-oxide semiconductor devices such as insulated gate field effect transistors or oxide dielectric capacitors which are formed by deposition of insulating and metallic layers on top of the semiconductor.

While the invention has been described with reference to specific methods and embodiments, it is to be understood that this description is not to be construed in a limiting sense. Various modifications of the disclosed embodiments, as well as other embodiments of the invention, may become apparent to persons skilled in the art without departing from the spirit and scope of the invention as defined by the appended claims.

What is claimed is:

1. In a method for fabricating individual circuit components within a semiconductor body, the step of:

(a) chemically reacting selected spaced portions of a semiconductor body to convert the semiconductor material of said portions into areas of an insulating compound of the original semiconductor material integral with the remainder of the body, said areas extending substantially the entire thickness of said body, thereby to electrically isolate unconverted portions of the semiconductor body.

2. In a method for fabricating individual circuit components within a semiconductor body, the steps of:

(a) selectively masking portions of the semiconductor body, and (b) chemically reacting the unmasked portions of said body to cause said unmasked portions to be converted into areas of an insulating compound of the original semiconductor material integral with the remainder of the body for substantially the entire thickness of said body, thereby to electrically isolate the unconverted masked portions of the said body.

3. In a method for fabricating individual circuit components within a semiconductor body, said components being electrically isolated from one another through the said body, the steps of:

(a) chemically reacting selected spaced portions of a semiconductor body to convert the semiconductor material of said portions into areas of an insulating compound of the original semiconductor material integral with the remainder of the body, said areas extending substantially the entire thickness of said body, thereby to electrically isolate unconverted portions of the semiconductor body, and (b) forming individual circuit components within said unconverted portions.

4. In a method for fabricating individual circuit components within a semiconductor body, said components being electrically isolated from one another through the said body, the steps of:

(a) forming individual circuit components within certain portions of said body, and (b) chemically reacting selected other spaced portions of said body to convert the semiconductor material of said other spaced portions into areas of an insulating compound of the original semiconductor material integral with the remainder of the body, said areas extending substantially the entire thickness of said body, thereby to electrically isolate said components through said body.

5. A method of fabricating individual circuit components within a silicon semiconductor body, said components being electrically isolated from one another through said body, comprising the steps of:

(a) selectively masking portions of the said silicon semiconductor body, (b) chemically reacting said body to cause the unmasked portions thereof to be converted into areas of an insulating compound of the original semiconductor material integral with the remainder of the body at a rate substantially greater than that of the masked portions of the said body, (c) stopping the chemical reacting of said bodv when the unmasked portions have their entire thickness converted to insulating material, thereby to electrically isolate unconverted regions of said masked portions from one another, and (d) forming individual circuit components within the said unconverted regions.

6. The process as described in claim 5 wherein said chemical reacting is by oxidizing, and said insulating material is silicon oxide.

7. A method of making individual circuit components within a body of semiconductor material comprising:

(a) placing a body of semiconductor material upon a substrate, (b) selectively masking portions of the said body, (c) chemically reacting the unmasked portions of the semiconductor body to convert the semiconductor material of said unmasked portions into areas of an insulating compound of the original semiconductor material integral with the remainder of the body for the entire thickness of the said unmasked portions, thereby to electrically isolate the unconverted masked portions of the said body from one another, (d) removing the mask, and (e) forming individual circuit components within said unconverted portions.

8. A mehod of making individual circuit components within a body of semiconductor material comprising:

(a) placing a body of semiconductor material upon an insulating substrate, (b) selectively masking portions of the said body, (c) chemically reacting the unmasked portions of the semiconductor body to convert the semiconductor material of said unmasked portions into areas of an insulating compound of the original semiconductor material integral with the remainder of the body for the entire thickness of the said unmasked portions, thereby to electrically isolate the unconverted masked portions of the said body from one another, (d) removing the mask, and (e) forming individual circuit components within the said unconverted portions.

9. A method of making individual circuit components within a body of semiconductor material comprising:

(a) placing a body of semiconductor material upon a semi-insulating substrate, (b) selectively masking portions of the said body, (c) chemically reacting the unmasked portions of the semiconductor body to convert the semiconductor material of said unmasked portions into areas of an insulating compound of the original semiconductor material integral with the remainder of the body for the entire thickness of the said unmasked portions, thereby to electrically isolate the uncovered masked portions of the said body from one another, (d) removing the mask, and (e) forming individual circuit components within the said unconverted portions.

References Cited

UNITED STATES PATENTS

| | | | |
|---|---|---|---|
| 3,150,299 | 9/1964 | Noyce | 317—235 |
| 3,158,788 | 11/1964 | Last | 317—101 |
| 3,169,892 | 2/1964 | Lemelson. | |
| 3,290,753 | 12/1966 | Chang | 29—577 |
| 3,300,832 | 1/1967 | Cave | 29—583 X |

WILLIAM I. BROOKS, *Primary Examiner.*

U.S. Cl. X.R.

148—6.3; 317—101; 117—62